(12) United States Patent
Castex et al.

(10) Patent No.: US 8,202,785 B2
(45) Date of Patent: Jun. 19, 2012

(54) SURFACE TREATMENT FOR MOLECULAR BONDING

(75) Inventors: Arnaud Castex, Grenoble (FR);
Gweltaz Gaudin, Grenoble (FR);
Marcel Broekaart, Theys (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/122,717

(22) PCT Filed: Oct. 27, 2009

(86) PCT No.: PCT/EP2009/064121
§ 371 (c)(1),
(2), (4) Date: Apr. 5, 2011

(87) PCT Pub. No.: WO2010/052151
PCT Pub. Date: May 14, 2010

(65) Prior Publication Data
US 2011/0189834 A1    Aug. 4, 2011

(30) Foreign Application Priority Data
Nov. 7, 2008   (FR) ...................... 08 57586

(51) Int. Cl.
*H01L 21/30* (2006.01)
*H01L 21/31* (2006.01)

(52) U.S. Cl. .. 438/455; 438/459; 438/787; 257/E21.122

(58) Field of Classification Search ............... 438/455, 438/459, 787; 257/E21.122
See application file for complete search history.

(56) References Cited

U.S. PATENT DOCUMENTS

| | | | |
|---|---|---|---|
| 6,500,694 B1 | 12/2002 | Enquist | 438/109 |
| 7,335,572 B2 | 2/2008 | Tong et al. | 438/406 |
| 7,588,994 B2 * | 9/2009 | Langdo et al. | 438/406 |
| 2003/0010425 A1 * | 1/2003 | Lee et al. | 156/182 |
| 2004/0152282 A1 * | 8/2004 | Tong et al. | 438/455 |
| 2006/0024915 A1 | 2/2006 | Kobayashi | 438/455 |
| 2006/0073673 A1 * | 4/2006 | Verhaverbeke | 438/455 |
| 2006/0189095 A1 * | 8/2006 | Ghyselen et al. | 438/458 |
| 2007/0119812 A1 | 5/2007 | Kerdiles et al. | 216/34 |
| 2007/0259605 A1 | 11/2007 | Otsuka et al. | 451/8 |
| 2008/0014754 A1 | 1/2008 | Kiehlbauch et al. | 438/710 |
| 2008/0036041 A1 * | 2/2008 | Knechtel et al. | 257/620 |
| 2008/0072926 A1 * | 3/2008 | Munakata | 134/2 |

(Continued)

FOREIGN PATENT DOCUMENTS
EP    1 566 830 A1    8/2005
(Continued)

OTHER PUBLICATIONS

International Search Report, PCT/EP2009/064121, mailed Feb. 4, 2010.

(Continued)

*Primary Examiner* — Kevin Parendo
(74) *Attorney, Agent, or Firm* — Winston & Strawn LLP

(57) ABSTRACT

A method of bonding a first substrate to a second substrate by molecular bonding by forming an insulating layer on the bonding face of the first substrate, chemical-mechanical polishing of the insulating layer, activating a bonding surface of the second substrate by plasma treatment, etching an exposed surface of the insulating layer, and bonding together the two substrates together by molecular bonding wherein the etching is conducted after the chemical-mechanical polishing and before the bonding.

15 Claims, 6 Drawing Sheets

U.S. PATENT DOCUMENTS

2009/0261064 A1 10/2009 Kerdiles et al. .................. 216/34
2010/0155882 A1* 6/2010 Castex .......................... 257/507

FOREIGN PATENT DOCUMENTS

WO    WO 2004/108617 A2    12/2004
WO    WO 2006/082751 A2    8/2006
WO    WO 2007/060145 A1    5/2007

OTHER PUBLICATIONS

Search Report for French application No. 0857586 dated Aug. 17, 2009.

* cited by examiner

SURFACE TREATMENT FOR MOLECULAR BONDING

This application is a 371 filing of International Patent Application PCT/EP2009/064121 filed Oct. 27, 2009.

TECHNICAL FIELD AND PRIOR ART

The present invention relates to the field of assembling wafers or substrates together by molecular bonding. More precisely, the invention relates to using molecular bonding to provide adhesion between two substrates, at least one of which presents a bonding surface that is structured, i.e. non-plane, in particular because of the presence of components, circuits, patterning, etc., made in full or in part. Such substrates are known as "patterned substrates" or as "structured wafers". The invention may be obtaining strong adhesion with any substrate of surface that needs to be polished (e.g. after depositing a layer of insulation that after assembly forms buried insulation), and that is not suitable for being exposed to high consolidation temperatures (as applies for example when performing a transfer using Smart Cut® technology or when forming a heterostructure).

FIGS. 1A to 1E show how a heterostructure is made by using molecular bonding to cause an initial substrate 110 to adhere on a final substrate or support substrate 120. As shown in FIG. 1A, the initial substrate 110 includes a plurality of circuits 111a to 111d on its adhesion surface 110a.

In well-known manner, adhesion by molecular bonding (known as "direct wafer bonding" or "fusion bonding") is a technique for bonding together two substrates that present surfaces that are perfectly plane ("mirror polish"), and without applying any adhesive (glue, solder, etc.). Bonding is typically initiated by local application of light pressure on the two substrates that have been put into intimate contact. A bonding wave then propagates over the entire extent of the substrates in a few seconds.

In order to enable the initial substrate 110 to be put into intimate contact on the support substrate 120, an oxide layer 112 is deposited on the surface 110a of the first substrate, e.g. a layer of tetraethoxy ortho silane (TEOS) (FIG. 1B). Nevertheless, as shown in FIG. 1B, the deposited oxide layer follows the relief of the components 111a to 111d that are present on the surface 110a. The oxide layer 112 is then polished by chemical-mechanical polishing (CMP) (FIG. 1C). The surface 112a of the layer 112 as polished in this way is then cleaned, dried, and scrubbed (e.g. in apparatus known as a "scrubber") so as to obtain a surface state that is compatible with molecular bonding.

Furthermore, the support substrate is covered in a thermal oxide layer 121, e.g. formed by oxidizing the surface of the substrate so as to facilitate molecular bonding with the oxide layer 112 deposited on the initial substrate (FIG. 1B). After the layer of thermal oxide 121 has been formed, its surface 121a is prepared for bonding. The treatments applied for preparing the surface 121a vary depending on the bonding energy that it is desired to obtain. If it is desired to obtain a standard level of bonding energy, i.e. a relatively weak level, then the surface 121a can be prepared by performing chemical-mechanical polishing followed by cleaning. Otherwise, if it is desired to obtain strong bonding energy between the two substrates, the preparation of the surface 121a comprises RCA type cleaning (i.e. a combination of a bath of SC1 ($NH_4OH$, $H_2O_2$, $H_2O$) adapted to removing particles and hydrocarbons, and a bath of SC2 (HCl, $H_2O_2$, $H_2O$) adapted to removing metallic contaminants), plasma surface activation, additional cleaning, and then scrubbing.

Once the surfaces 112a and 121a have been prepared, they are put into intimate contact and pressure is applied on one of the two substrates in order to initiate propagation of a bonding wave between the surfaces in contact (FIG. 1D). Bonding is subsequently reinforced by performing thermal annealing at a temperature lying in the range 300° C. to 400° C., approximately.

Fabrication of the heterostructure is then continued by thinning the initial substrate 110 so as to form a transferred layer 113. Finally, the structure is subject to an edge roll-off operation so as to remove the chamfers or drops present at the periphery of the transferred layer 113. Thus, as shown in FIG. 1E, a heterostructure 100 is obtained that comprises the support substrate 120 and the transferred layer 113.

Nevertheless, such a heterostructure is exposed to peel-off problems at the bonding interface between the transferred layer and the support substrate, in particular during edge roll-off. More precisely, peel-off problems correspond to the transferred layer delaminating in certain regions in the vicinity of the periphery of the layer. Bonding energy is weaker in the vicinity of the coupling of the layer because of the presence of the chamfers or drops. Consequently, peel-off can lead at such a location to partial separation of the layer at its bonding interface with the support substrate.

This peel-off phenomenon may be limited by strengthening the molecular bonding energy, e.g. by plasma activation of the bonding surface of the support substrate, as described above.

Nevertheless, although strengthening the bonding energy enables peel-off problems to be limited, defects such as edge voids are observed at the transferred layer. Edge voids are defects that result from the bonding and that are typically observed at the periphery of the final structure (generally in the form of a circular wafer). Such edges voids are holes or bubbles (e.g. having a diameter of about 10 micrometers (µm) to 250 µm) in the transferred layer or at the bonding interface and that correspond to regions of the initial substrate that are not transferred to the support substrate. Edge voids usually appear at the edge (peripheral region) of the thin layer structure on a supporting substrate (circular wafer). They are situated at a distance that lies typically in the range 1 millimeter (mm) to 6 mm from the edge of the wafer.

Edge voids are thus macroscopic defects associated with poor bonding at the edge of the wafers. They constitute defects that are destructive since given the size of such voids, an electronic component located at least one edge void is necessarily defective. FIG. 2 shows very diagrammatically a structure 10 after bonding and heat treatment to strengthen the bonding in which at least one of the bonding surfaces of the assembled-together substrate has been subjected to chemical-mechanical polishing. In the context of the invention, and as shown in FIG. 2, edge void type defects are observed comprising defects 12 that are present at the periphery of the wafers and that appear to be aligned on defects that result from the polishing step (micro-scratches for example), as contrasted with "standard" edge voids 11. However, these defects are not all directly observable after bonding and they may also become apparent after the heat treatment step for strengthening the bonding interface.

Methods have already been proposed for reducing edge void type defects that appear during molecular bonding of two substrates. Document US 2007/0119812 proposes a method consisting in modifying the surface state, by heating or by roughening, of at least one of the two substrates for assembly in such a manner as to control (and in particular slow down) the propagation speed of the bonding wave.

SUMMARY OF THE INVENTION

One of the objects of the invention is to remedy the above-mentioned drawbacks by proposing a solution that enables good molecular bonding to be obtained between two substrates, at least one of which has been subjected to chemical-mechanical polishing, and to do so while limiting the appearance of defects, and in particular of defects of the edge void type.

To this end, the invention proposes a method of bonding a first substrate on a second substrate by molecular bonding, the method comprising the following steps: forming a layer of insulation on the bonding face of the first substrate (e.g. an oxide); chemical-mechanical polishing said layer of insulation; activating the bonding surface of the second substrate by plasma treatment; and bonding together the two substrates by molecular bonding, in which method, after the chemical-mechanical polishing step and before the bonding step, a step is performed, in accordance with the invention, of etching the surface of the layer of insulation formed on the first substrate.

By eliminating the majority of defects or by minimizing the impact of the defects (scratches, particles, etc.) that result from chemical-mechanical polishing, and/or by modifying their morphology, this etching step serves to diminish or eliminate the obstacles that may lie on the propagation path of the bonding wave during the molecular bonding process, thereby very significantly reducing or even eliminating the appearance of edge void type defects. Consequently, at the end of this propagation, a continuous bonding interface is obtained over the entire surfaces of the substrates that have been put into contact. This avoids the appearance of defects of the edge void type that are usually observed after bonding or strengthening said bonding using prior art techniques.

The thickness of the insulating layer that is removed during etching is at least 20 angstroms (Å), and is preferably at least 50 Å, e.g. lying in the range 100 Å to 300 Å.

In an aspect of the invention, the method further includes using plasma treatment to activate the surface of the layer of insulation formed on the first substrate, said activation being performed after the step of etching said surface of the layer of insulation.

In another aspect of the method, the method further includes, after the step of etching the surface of the layer of insulation formed on the first substrate, depositing a fine oxide layer on said surface of the etched layer of insulation, it being possible subsequently to perform activation of the surface of said fine oxide layer by plasma treatment.

The etching may be performed in particular using an SC1 solution (mixture containing 1 volume of ammonium hydroxide ($NH_4OH$), 5 to 22 volumes of hydrogen peroxide ($H_2O_2$), and 5 volumes of deionized water ($H_2O$)) at a temperature of 70° C. for a duration of at least 5 minutes, or indeed with a solution of hydrofluoric acid (HF at 1%) at "room" temperature (generally taken to be about 25° C.) for a duration of less than 1 minute, i.e. a few seconds, e.g. 10 seconds.

In another aspect of the invention, a layer of insulation, e.g. an oxide, is also formed on the second substrate. Prior to bonding, the surface of the oxide layer may be activated by plasma treatment so as to increase bonding energy.

By means of the method of the invention that enables the bonding surface of the oxide layer to be prepared after CMP, the influence of that or those activations on the appearance of edge void type defects is considerably limited, or even eliminated, unlike in prior art methods.

In another aspect of the invention, the first substrate includes components on at least a fraction of its bonding surface. Under such circumstances, the annealing step for strengthening the bonding may be performed after bonding and at a temperature of less than 500° C.

Since the method of the invention makes it possible simultaneously to obtain bonding energy between the substrates that is relatively great, in particular by activating the bonding surface, and to prevent edge void type defects appearing, the structure that is obtained by bonding together the two substrates can be subjected to edge roll-off while minimizing any risk of peel-off from the bonding interface.

BRIEF DESCRIPTION OF THE FIGURES

Other features and advantages of the invention appear on reading the following description given by way of non-limiting indication and with reference to the accompanying drawings, in which.

DETAILED DESCRIPTION OF IMPLEMENTATIONS OF THE INVENTION

Figure 1A:
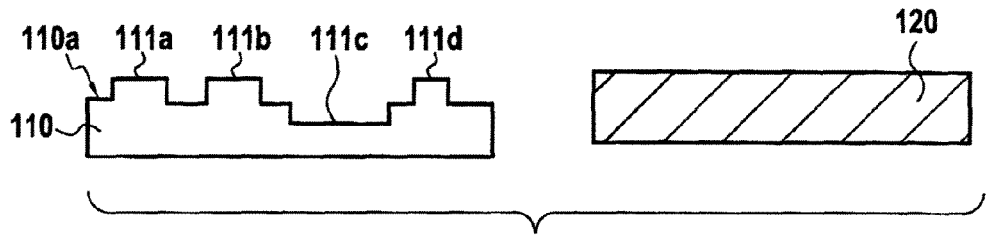
FIGS. 1A to 1E are diagrammatic views showing a prior art method of making a heterostructure.
Figure 1B:
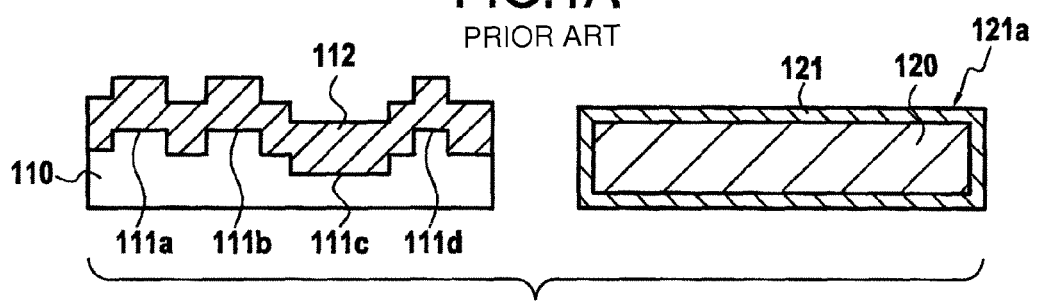
Figure 1C:
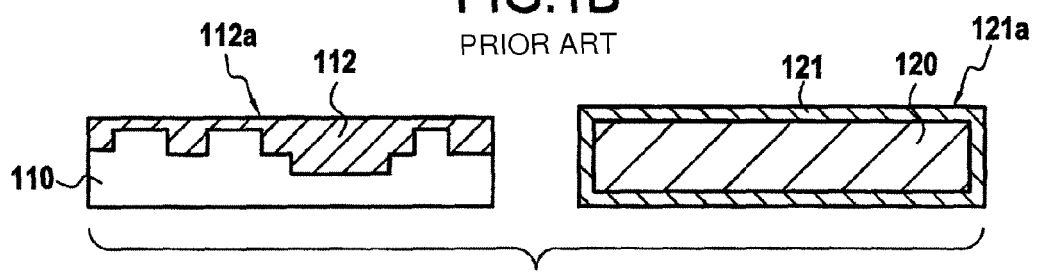
Figure 1D:
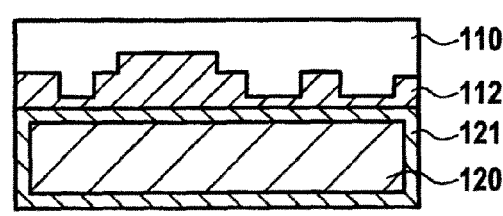
Figure 1E:
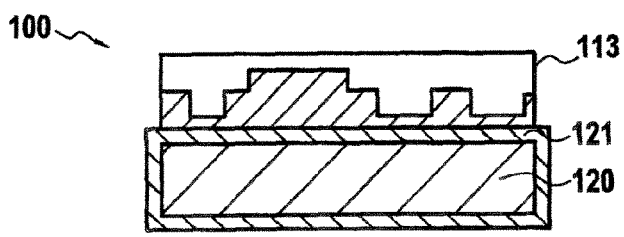
Figure 2:
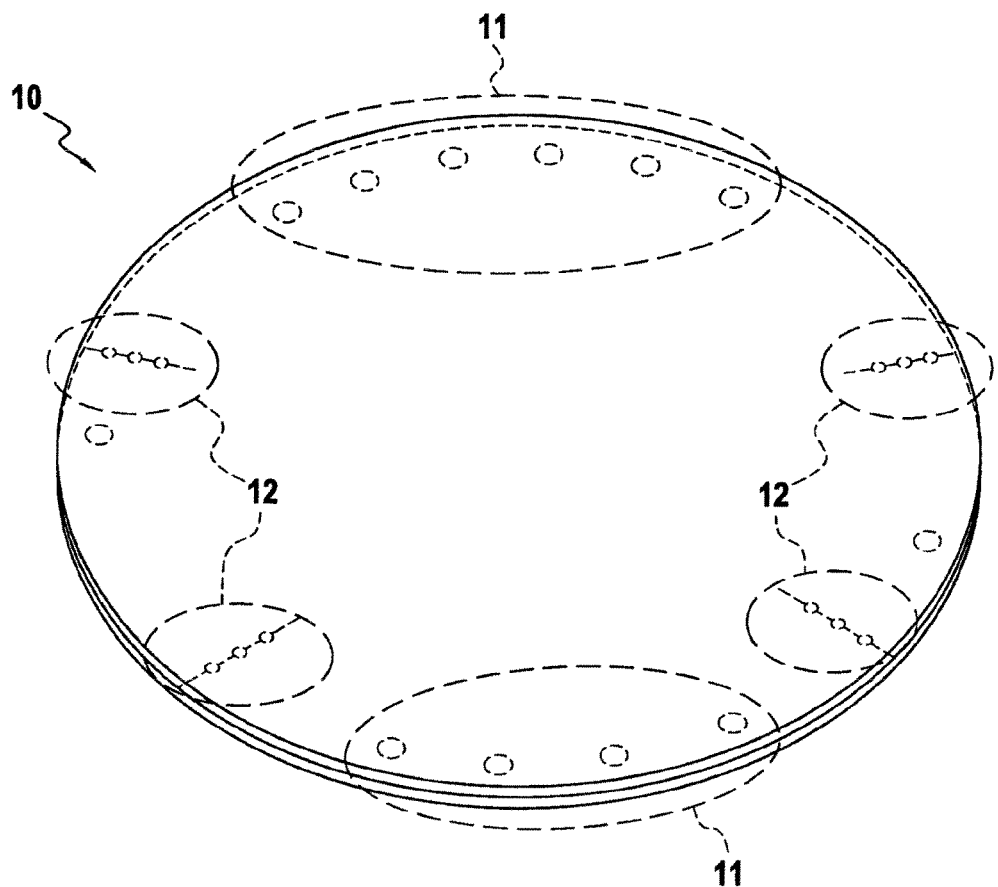
FIG. 2 is a highly diagrammatic view of a prior art structure formed by assembling together two substrates.

The method of the present invention applies in general to using molecular bonding to cause two substrates or wafers to adhere to each other, with at least one of the two substrates including a layer of insulation on its bonding surface, e.g. an oxide layer, that has been planarized by chemical-mechanical polishing.

The method of the invention finds a particular, but not exclusive, application in using molecular bonding to obtain adhesion on an initial or donor substrate, also referred to as a "top" substrate, that presents relief on its bonding face so as to require an oxide layer to be deposited and to be planarized so as to make molecular bonding possible.

The invention applies even more particularly to bonding together substrates that include relief on their bonding surfaces or faces that results from forming components. The term "component" is used here to mean any type of element made using materials that are different from the material of the wafer and that are sensitive to the high temperatures commonly used for strengthening the bonding interface. Such components correspond in particular to elements that form all or part of an electronic component or a plurality of electronic components, such as circuits or contacts or indeed active layers, which can be damaged or even destroyed should they be exposed to high temperatures. Bonded substrates may include materials having coefficients of expansion that are different from one another and that are liable, at high temperature, to give rise to differential expansions that can deform and/or damage the assembly.

In other words, the substrate is not suitable for being subjected to high temperature annealing after bonding, as is done for example with an implanted substrate when transferring a layer using the Smart Cut® technique. Consequently, the bonding energy between the substrates is limited, thus requiring at least one of the bonding surfaces of the two substrates for assembly to be activated (i.e. the support substrate and/or the "donor" substrate) in order to increase the bonding energy. This activation is performed by plasma treatment that, as explained above, is a source leading to the appearance of edge void type defects during and after propagation of the bonding wave.

As is well known, the principle of molecular bonding, also known as direct bonding, is based on direct contact between two surfaces, i.e. without using any specific bonding material (adhesive, wax, solder, etc.). Such an operation requires the surfaces for bonding to be sufficiently smooth, exempt from particles or contamination, and to be sufficiently close together to enable contacts to be initiated, typically at a distance of less than a few nanometers. Under such circumstances, the forces of attraction between the two surfaces are high enough to give rise to molecular bonding (bonding induced by all of the attractive forces (Van Der Waals forces) of electron interaction between atoms or molecules of the two surfaces to be bonded together).

Chemical-mechanical polishing is a polishing or planarizing technique that is well known and that makes use of a fabric associated with a polishing solution containing both an agent suitable for chemically attacking the surface of the layer (e.g. $NH_4OH$) and abrasive particles suitable for mechanically attacking said surface (e.g. particles of silica).

Nevertheless, CMP leads to defects such as particles, scratches, etc. both on the surface of the polished oxide layer and below it (over a limited depth). These defects form obstacles on the propagation path of the bonding wave that give rise to the appearance of defects of the edge void type, as described above. It has been observed that certain voids can be present at the edge of the wafer and in alignment on "micro-scratch" defects that are the result of the polishing. These defects thus appear to be conducive to forming/nucleating edge void type defects.

As described in detail below, the invention provides a molecular bonding method in which, after chemical-mechanical polishing of the oxide layer deposited on the bonding surface of the substrate, chemical etching is performed on the surface of the oxide layer so as to prevent defects of the edge void type from forming during subsequent molecular bonding.

The method of the invention is applicable to substrates or wafers made in particular using semiconductor materials such as silicon, germanium, glass, quartz, sapphire, etc. The substrates or wafers that are to be assembled together may in particular have a diameter of 100 mm, 150 mm, 200 mm, or 300 mm. The wafers may also include microcomponents over the majority of their surfaces, or over only a limited region.

A method of making a heterostructure from an initial substrate 210 (top) and a final substrate or support substrate 220 (base) is described below with reference to FIGS. 3A to 3G, and 4.

Figure 3A:
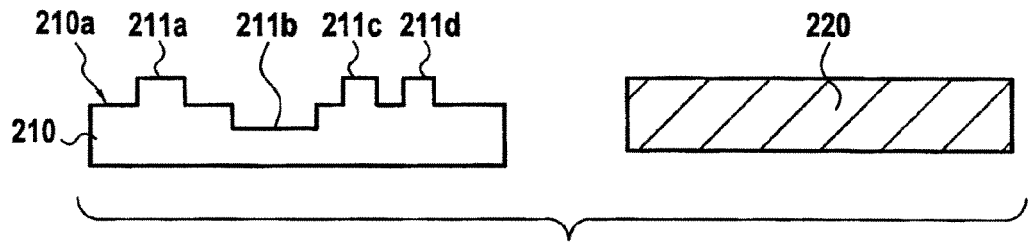
FIGS. 3A to 3G are diagrammatic views showing how a heterostructure can be made by implementing a bonding method of the invention.

As shown in FIG. 3A, the initial substrate 210 includes a plurality of circuits 211a to 211d on its bonding face 210a and forming portions in relief thereon. The initial substrate may be constituted by a silicon wafer or by a multilayer structure such as a structure of the silicon-on-insulation (SOI) type. The final substrate 220 is constituted by a silicon wafer.

Figure 3B:
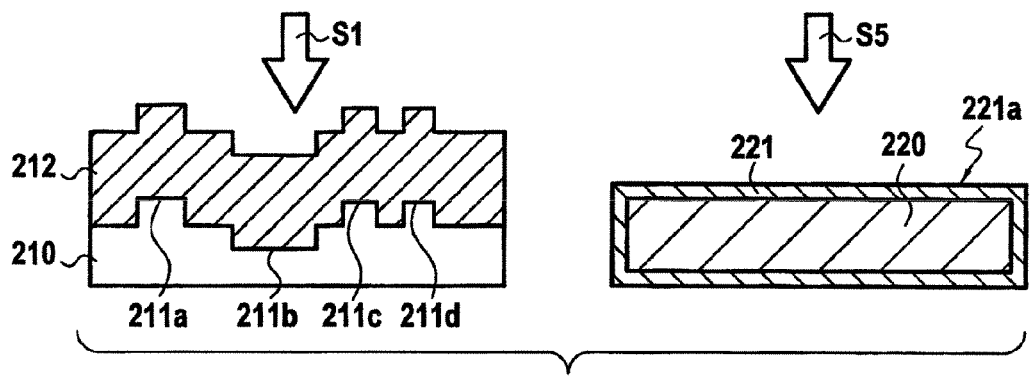
Figure 3C:
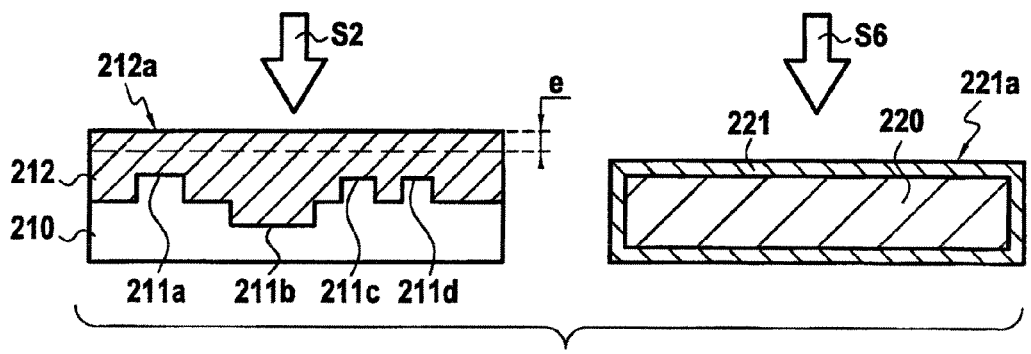
Figure 3D:
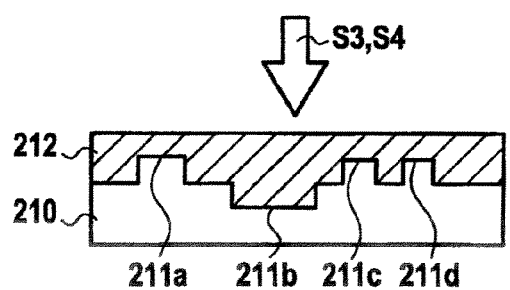

In order to enable the initial substrate 210 to be put into intimate contact on the support substrate 220, an insulating layer is deposited, in this example an oxide layer 212, e.g. a tetraethoxy ortho silane (TEOS) oxide, on the face 210a of the first substrate (step S1 and FIG. 3B). Other oxides such as silane or oxides including boron such as borophosphosilicate glass (BPSG) could equally well be used, for example. The oxide layer 212 is made, for example, by plasma-enhanced chemical vapor deposition (PECVD), or by low pressure chemical vapor deposition (LPCVD) such as metal organic chemical vapor deposition (MOCVD). The layer 212 has a mean thickness lying in the range 0.1 µm to 10 µm, approximately.

As shown in FIG. 3B, the deposited oxide layer 212 follows the shape in relief of the components 211a to 211d present on the face 210a. The oxide layer 212 is then subjected to CMP (step S2 and FIG. 3C).

In accordance with the invention, the oxide layer 212 is subjected to chemical etching so as to prevent edge void type defects forming (step S3 and FIG. 3D) during molecular bonding.

During chemical etching, a thickness e (FIG. 3C) of at least 20 Å of the oxide layer is removed so as to eliminate or at least limit the impact of the defects (particles, scratches, etc.) that result from CMP and that are responsible for the appearance of edge void type defects after bonding.

This chemical etching may be performed by dipping the layer 212 in a bath containing a solution of SC1 at a temperature of 70° C. and for a duration of at least 5 minutes.

In a variant, the chemical etching is performed by dipping the layer 212 in a bath containing a 1% solution of hydrofluoric acid (HF) at "room" temperature (generally taken to be about 25° C.) for a duration of less than 1 minute, i.e. a few seconds, e.g. 10 seconds.

The etching time is determined as a function of the nature and/or the concentration and/or the temperature at which the etching solution is used (these parameters defining rate of etching).

With the surface 212a of the layer 212 etched in this way, preferably over a thickness lying in the range 100 Å to 300 Å, the surface is then cleaned, dried, and scrubbed so as to obtain a surface state that is compatible with molecular bonding and thus form the bonding surface of the initial substrate 210 (step S4). In known manner, and as described in particular in U.S. Pat. No. 7,235,461, the surface 212a may be scrubbed by means of a rotary brush that typically has a cylindrical shape. The brush may be provided with a textured material, such as a polymer, on its peripheral surface for coming lightly into contact with the surface 212a of the layer 212. During scrubbing, the initial substrate 210 carrying the layer 212 may be set into rotation. The scrubbing may also be performed under a flow of water, possibly associated with ammonia (dilute ammonia).

Furthermore, the support substrate is covered in a layer of thermal oxide 221, e.g. formed by oxidizing the surface of the substrate, so as to facilitate molecular bonding with the oxide layer 212 deposited on the initial substrate (step S5 and FIG. 3B). After the thermal oxide layer 221 has been formed, its surface 221a is prepared for bonding (step S6 and FIG. 3C).

In order to obtain high bonding energy between the two substrates, the surface 221a may be activated by plasma treatment. This activation is particularly advantageous when the temperature at which annealing can be performed for strengthening the bonding is limited.

The surface 212a of the layer 212 corresponding to the bonding surface of the initial substrate 210 may also be activated by plasma treatment. Nevertheless, this activation is performed after the etching step. Inverting the order of these steps would lead to the etching step eliminating the activation effect produced by the plasma treatment.

Thus, the surface(s) may be exposed to plasma based on oxygen, nitrogen, argon, or other material.

The equipment used for this purpose may, amongst other things, be initially designed for performing reactive ion etching (RIE) with capacitive coupling, or with inductively coupled plasma (ICP). For further details, reference may be for example to the document by Sanz-Velasco et al. entitled "Room temperature wafer bonding using oxygen plasma treatment in reactive ion etchers with and without inductively coupled plasma" (Journal of Electrochemical Society 150, G155, 2003).

These plasmas may also be immersed in a magnetic field, in particular to avoid electrically-charged species diffusing towards the walls of the reactor, by using equipment of the magnetically-enhanced reactive ion etching (MERIE) type.

The density of the plasma may be selected to be low, medium, or high as in high-density plasma (HDP).

In practice, bonding activation by means of a plasma generally involves a prior chemical cleaning step such as RCA cleaning (i.e. using a combination of an SC1 bath ($NH_4OH$, $H_2O_2$, $H_2O$) adapted to removing particles and hydrocarbons, and a SC2 bath (HCl, $H_2O_2$, $H_2O$) adapted to removing metallic contaminants, followed by exposing the surface to a plasma for several seconds to several minutes.

One or more cleaning operations may be performed after exposure to plasma, in particular for the purpose of removing contaminants introduced during exposure, such as rinsing in water and/or cleaning in SC1, optionally followed with drying by centrifuging. Nevertheless, such cleaning may be replaced by scrubbing that enables a large portion of the contaminants to be eliminated.

Figure 3E:
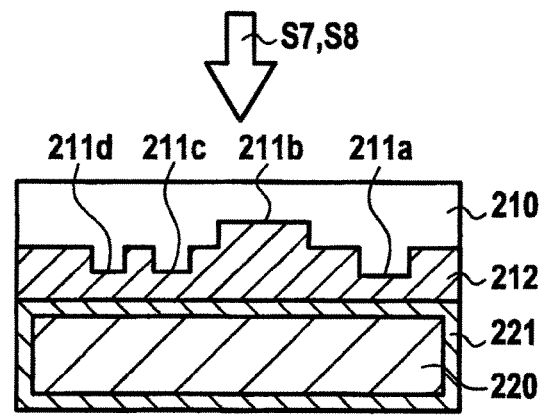

Once the surfaces 212a and 221a have been prepared, they are put into intimate contact and pressure is applied to one of the two substrates in order to initiate propagation of a bonding wave between the two surfaces in contact (step S7 and FIG. 3E).

The bonding is then strengthened by performing thermal annealing (step S8). When the initial substrate includes components such as in the present example, the annealing for strengthening bonding is performed at a temperature that is preferably less than 500° C., the temperature at which certain metals such as aluminum or copper begin to creep.

Figure 3F:
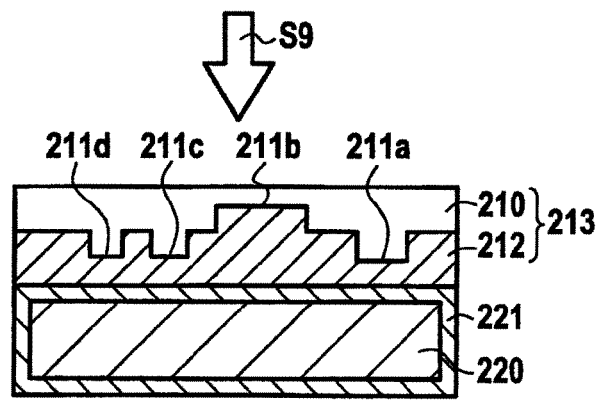
Figure 3G:
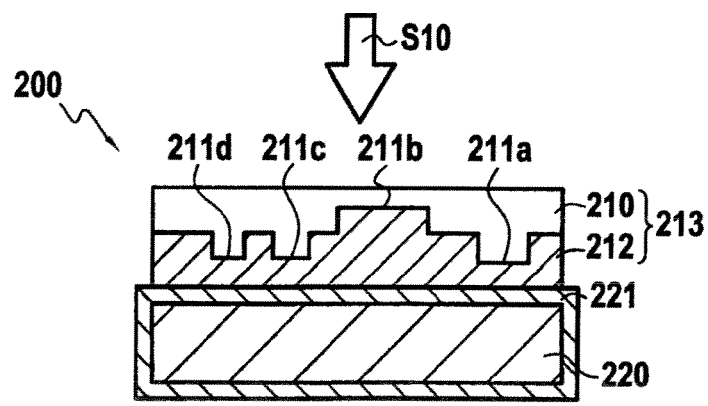
Figure 4:
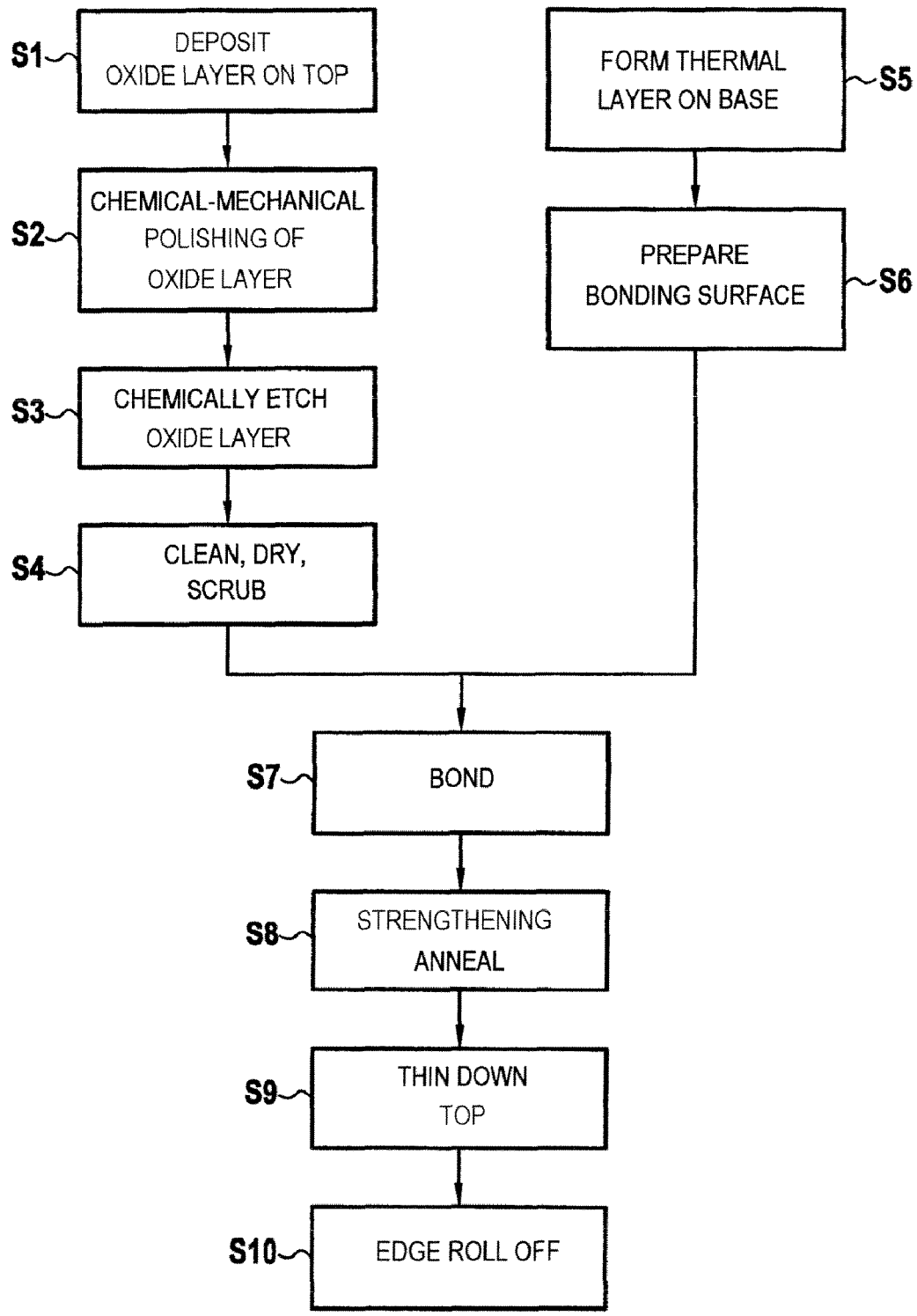
FIG. 4 is a flow chart of the steps implemented while making the three-dimensional structure shown in FIGS. 3A to 3G.

Fabrication of the heterostructure is continued by thinning the initial substrate 210 so as to form a transferred layer 213 (step S9 and FIG. 3F). Finally, the structure is subjected to edge roll-off in order to remove chamfers and drops that are present at the periphery of the transferred layer 213 (step S10). As shown in FIG. 3G, this produces a heterostructure 300 comprising the support substrate 220 (with its thermal oxide layer 221) and the transferred layer 213.

In a variant of the invention, a three-dimensional structure is formed as a stack of layers, i.e. by transferring one or more additional layers on to the top layer. Before each transfer of an additional layer, it is possible to deposit an oxide layer on the exposed layer, e.g. a layer of TEOS oxide in order to facilitate assembling and protecting the edge roll-off regions (where the material of the underlying wafer is exposed) from subsequent chemical attack. It is then possible to apply the surface preparation steps in accordance with the invention for each layer transfer.

In a particular implementation, one of the microcomponent layers may comprise image sensors.

In another implementation, components are formed beforehand in the second support wafer prior to it being assembled with the first wafer constituting the transferred layer. Under such circumstances, instead of thermally oxidizing the support wafer, which is not possible because of the presence of the components, it is possible to form the insulation by deposition.

Figure 5:
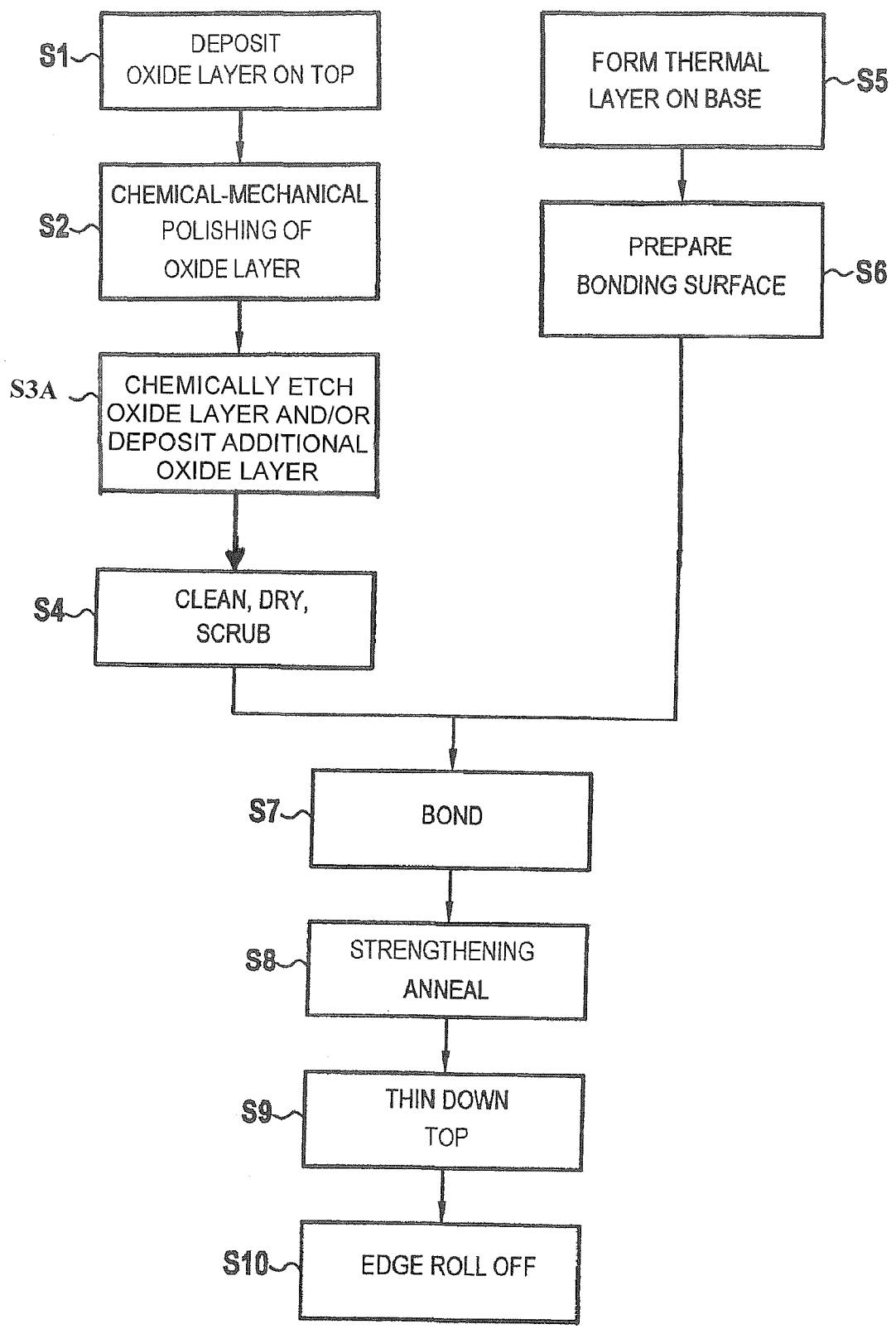
FIG. 5 is a flow chart illustrating the steps implemented in making the three-dimensional structure that includes an oxide later on the etched or non-etched surface of the first substrate.

In a variant implementation, instead of eliminating the CMP defects by etching, or in addition to said etching, it is possible to envisage depositing a fine layer of oxide after the CMP and/or the etching in order to avoid the harmful impact of such defects on bonding quality. FIG. 5 illustrates the steps of this variant. This Figure is similar to that of FIG. 4 and where the same steps are used the same designations are provided, i.e., S1, S2, etc. FIG. 5 illustrates a different step S3A, which includes depositing a further oxide layer upon the polished layer either in lieu of or after etching. The fine oxide layer may, for example, have thickness lying in the range a few angstroms to 300 nanometers (nm), e.g. lying in the range 500 Å to 1000 Å, which layer is deposited for example in a high-density plasma chamber using a plasma based on oxygen and silane. This deposition step after polishing and etching may be finished off by a step of activation by plasma treatment of the surface of the deposited fine oxide layer.

What is claimed is:

1. A method of bonding a first substrate to a second substrate by molecular bonding by forming an insulating layer on the bonding face of the first substrate, applying chemical-mechanical polishing to an exposed surface of the insulating layer, etching the polished surface of the insulating layer to reduce or eliminate polishing defects, depositing an oxide layer on the etched surface of the insulating layer, activating a bonding surface of the second substrate by plasma treatment, and bonding together the two substrates together by molecular bonding of the oxide layer of the first substrate to the activated bonding surface of the second substrate, wherein the etching is conducted after the chemical-mechanical polishing and before the depositing of the oxide layer and the bonding to thus reduce or eliminate edge void defects that are generated due to polishing defects.

2. The method according to claim 1, wherein the activation of the second substrate bonding surface is achieved with a plasma treatment.

3. The method according to claim 1, which further comprises activating the etched surface of the insulating layer with a plasma treatment prior to bonding.

4. The method according to claim 1, which further comprises activating the exposed surface of the oxide layer with a plasma treatment prior to bonding.

5. The method according to claim 1, wherein, during the etching, a thickness of at least 20 Å of the insulating layer is removed.

6. The method according to claim 1, wherein during the etching, a thickness of 100 Å to 300 Å of the insulating layer is removed.

7. The method according to claim 6, wherein the etching is performed with a solution of SC1 at a temperature of 70° C. for a duration of at least 5 minutes.

8. The method according to claim 6, wherein the etching is performed with a 1% solution of hydrofluoric acid at room temperature for a duration of less than 1 minute.

9. The method according to claim 1, which further comprises forming an oxide layer on the second substrate prior to activating and bonding.

10. The method according to claim 1, wherein the first substrate includes components on at least a portion of its surface, and the insulating layer is formed by deposition.

11. The method according to claim 10, wherein the components include image sensors.

12. The method according to claim 10, which further comprises conducting an annealing after bonding for strengthening the molecular bond between the substrates, wherein the annealing is performed at a temperature of less than 500° C.

13. The method according to claim 1, wherein the first substrate comprises a silicon on insulator structure.

14. The method according to claim 1, which further comprises performing an edge roll-off step after bonding.

15. The method according to claim 1, wherein the oxide layer has a thickness of 500 Å to 1000 Å.

* * * * *